United States Patent [19]

Henrickson et al.

[11] 4,102,039
[45] Jul. 25, 1978

[54] METHOD OF PACKAGING ELECTRONIC COMPONENTS

[75] Inventors: David L. Henrickson, Phoenix; John J. Kaiser, Scottsdale, both of Ariz.; William C. Koehn, Glasgow, Scotland; David P. Raven, North Wales, Pa.

[73] Assignee: Motorola, Inc., Schaumburg, Ill.

[21] Appl. No.: 768,298

[22] Filed: Feb. 14, 1977

[51] Int. Cl.² ............................................. H01L 21/66
[52] U.S. Cl. ............................................. 29/593; 29/574; 29/576 S; 29/588; 29/627; 264/251; 264/272
[58] Field of Search .................. 29/593, 574, 576 S, 29/588, 627; 264/251, 272

[56] References Cited

U.S. PATENT DOCUMENTS

| | | | |
|---|---|---|---|
| 3,606,673 | 9/1971 | Overman | 29/588 |
| 4,012,766 | 3/1977 | Phillips et al. | 29/588 X |
| 4,026,008 | 5/1977 | Drees et al. | 29/576 S X |

*Primary Examiner*—Victor A. DiPalma
*Attorney, Agent, or Firm*—Robert D. Lott

[57] ABSTRACT

A carrier structure for electronic components which allows safe handling, testing, marking and shipment is fabricated as an integral part of the electronic component package. The carrier forms a square protective enclosure surrounding the electronic device and connected to the electronic device by breakable plastic tabs which are molded with the electronics component package. The structure allows the electrical leads of the electronic component to be trimmed, formed, and tested while the component is still attached to the carrier.

4 Claims, 4 Drawing Figures

METHOD OF PACKAGING ELECTRONIC COMPONENTS

BACKGROUND OF THE INVENTION

The present invention relates generally to the manufacture of small electronic components and, more particularly, to a structure and process of encapsulating the components and to the production of an associated carrier structure for testing and transporting the electrical components.

Electronic components, especially semiconductor devices such as transistors and integrated circuits, have been encapsulated in plastic in the past. For example, U.S. Pat. No. 3,716,764, issued to R. O. Birchler, et al., describes the standard encapsulation techniques for the TO-92 package. Similarly, other standard plastic packages have been developed and are in wide-spread use in the electronics industry.

However, a common problem associated with electronic components is providing a suitable means of handling these components without damage for purposes of testing, marking, and shipment. This is especially true of package types which are small and have fragile leads. They are characterized by a molded plastic body in the form of a small rectangular bar constructed to protect and hold the semiconductor die and wire bonds and to also hold the three package leads in place. The metal tabs extending from the body are flat and thin and must be precisely formed so as to form a flat bonding surface which lies just below the bottom surface of the body. As a result, the leads associated with this device are fragile and easily bent.

In the past, these types of packages with fragile leads have been protected by utilizing special carriers designed for this purpose. While these carriers are necessary for the protection of the device, they have several undesirable features. First, there is the initial expense in buying the carriers. Also, since the semiconductor chip itself is fairly inexpensive, the cost of the carrier becomes a significant part of the cost of the delivered product. Secondly, there is additional money and time expended in the process of loading each device into each carrier and removing the device again prior to insertion into the circuit. Thus, it can be appreciated that some sort of protective means which does not involve a separate carrier is highly desirable.

Accordingly, it is an object of this invention to provide inexpensive yet convenient carrier package for electronic components.

It is also an object of this invention to construct a carrier structure which requires no additional labor to produce the carrier above the labor necessary to encapsulate the electronic component.

It is still another object of this invention to provide a carrier structure which does not put any stresses on the device leads during handling and shipment.

It is also an object of this invention to use some of the plastic which would normally be discarded as the carrier structure for electronic components.

It is still another object of this invention to provide a method whereby a carrier structure holds the electronic component with plastic tabs allowing easy separation of a component and the carrier.

It is still another object of this invention to provide a carrier which will protect precisely formed leads of the electronic component from being damaged during testing, marking, shipping, or other handling.

It is still another object of this invention to provide an asymmetric carrier package which can be bowl fed into an automatic component loading mechanism rather than requiring that the electronic components to be loaded into a component magazine for later automatic insertion into an electronic circuit.

BRIEF SUMMARY OF THE INVENTION

One embodiment of this invention comprises a protective carrier which surrounds an encapsulated electronic component and is attached to the encapsulated component with breakable tabs to hold the component in place inside the carrier. The depth of the carrier is such that the trimmed and formed leads of the component are fully protected during handling and testing of the device. The carrier is formed as an integral unit with the component during the molding process.

Also provided is a method for manufacturing this protective carrier.

DESCRIPTION OF THE PREFERRED EMBODIMENT

In order to better understand the structure of the present invention and also to facilitate the description of best method for making the invention, the structure will be described in terms of the process steps involved in building the integral carrier.

Figure 1:
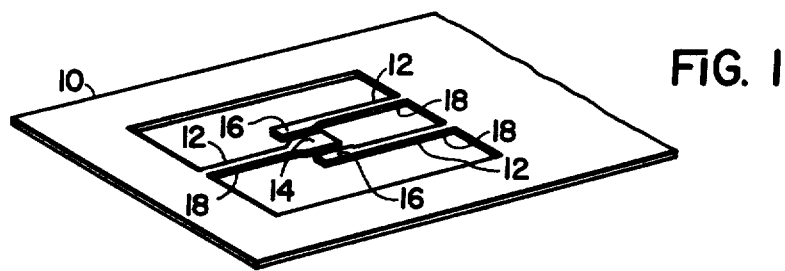
FIG. 1 is a drawing of a metal lead frame structure which is the first element of the fabrication process.
Figure 2:
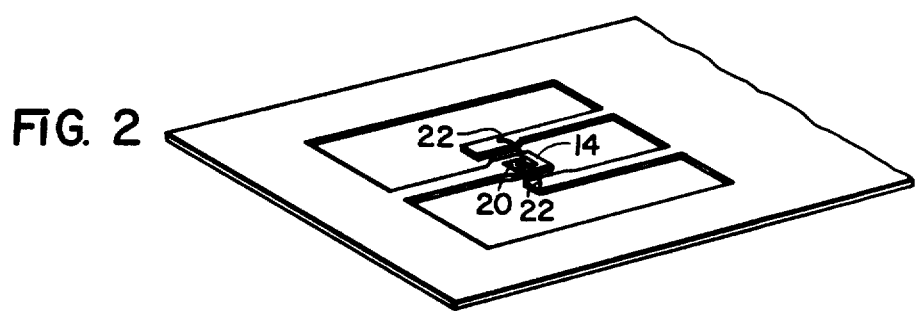
FIG. 2 is a drawing of the metal frame structure of FIG. 1 in which transistor semiconductor devices have been attached and wire bonds have been added.

Referring to FIG. 1, the manufacturing process begins with a lead frame 10 which has been either etched or stamped to produce metal fingers 12 which will become the die site 14, wire bond pads 16, and leads 18 on the finished product. For simplicity only one carrier structure is shown, but in actual manufacture a plurality of structures would be formed on each metal frame. In FIG. 2 a semiconductor device 20, in this case a transistor, has been bonded to the die site 14 and wire bonds 22 have been attached to the die and metal frame.

Figure 3:
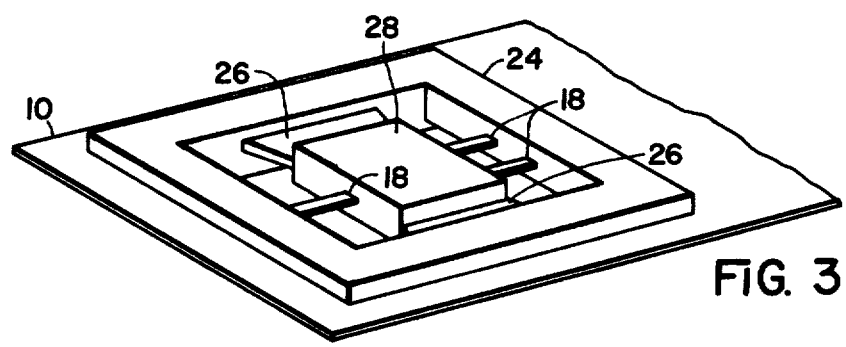
FIG. 3 shows the metal frame, carrier, and electronic device after the plastic encapsulation process.

FIG. 3 shows the structure after plastic has been molded using conventional techniques to incapsulate the transistor die and wire bonds and to form the carrier 24 and connecting tabs 26 to the package 28. It is important to note that the carrier is formed in the same step as the encapsulation of the electronic device and, therefore, no more additional labor is involved in producing the carrier. Also, the carrier is made up some of the of plastic which would normally be wasted in the molding process thereby reducing the material cost of the carrier.

Figure 4:
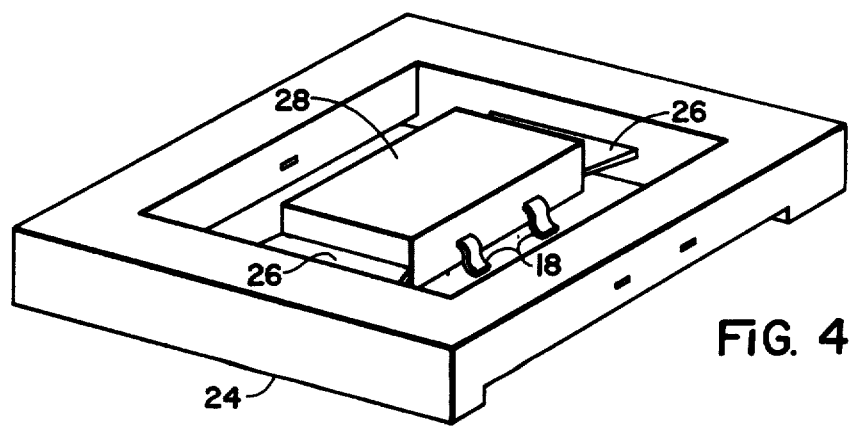
FIG. 4 shows a detail of one of the components and its protective ring after the structure has been removed from the metal frame and the leads have been cut and formed.

FIG. 4 depicts the integral carrier 24, connecting tabs 26, device 28 after the package leads 18 have been cut from the metal frame 10 and formed into position. Also, each of the carrier structures have been removed from the metal frame. However, it would be possible to cut, form the leads, test, mark and ship the devices while still in the metal frame to give additional support, protection, and ease of handling.

Several important advantages accrue from this structure. First, the device's leads are electrically isolated except for the electronic device encapsulated in the package. This allows both the supplier and user to test the device while still being held by the integral carrier. Second, the electronic component is being held in place by plastic tabs rather than relying on the intrinsic strength of the leads of the device itself. Thus, no stress is placed on the leads during handling and shipment. Third, the formed leads are completely surrounded by the carrier and, therefore, protected during handling and shipment. That is, the bottom of the carrier extends below the formed leads of the device. A further advantage of the carrier structure is that the package is asymmetric which allows the structure to be bowl fed, mechanically orienting the device with a vibrating spiral feeder, eliminating the need for the devices to be loaded into a magazine cartridge for use in automated insertion machines. The asymmetry is realized by the flat surface on the top of the carrier and the rails at the bottom of the carrier providing top-to-bottom asymmetry, and the difference in width of the left-hand rail versus the right-hand rail which gives left-to-right asymmetry. That is, the right-hand rail is approximately ten to fifteen thousandths wider than the left-hand rail which is enough asymmetry to allow bowl feeding devices to properly orient the device prior to insertion into a circuit.

Although the invention has been described in its application for use with the illustrated package, it can be understood that the same integral carrier structure can be used with other plastic-type packages, and that those skilled in the art will also understand the various changes in form that may be made without departing from the spirit and scope of the invention.

What is claimed is:

1. A method of packaging an electronic component which comprises:
   (a) providing a lead frame having a plurality of device sites and associated terminals at each device site,
   (b) attaching at each device site a device to its associated terminals for forming an electrical connection therebetween, and
   (c) forming in a single molding step,
      a plastic coating over said device for producing an encapsulated device,
      a plastic carrier disposed around said encapsulated device, and
      frangible plastic tabs integrally connnecting said encapsulated device to said carrier for maintaining said encapsulated device in a fixed supported position within said carrier.

2. A method of packaging an electronic component as in claim 1 which comprises:
   (a) severing said terminals from said lead frame subsequent to said single molding step for providing insulated leads to each device; and
   (b) bending said isolated leads into a desired configuration for forming an in situ testable device.

3. A method of packaging an electronic component as in claim 2 which comprises:
   (a) testing said in situ device subsequent to bending said isolated leads.

4. A method of packaging an electronic component as in claim 3 which comprises:
   (a) severing said in situ device from its associated plastic tabs subsequent to testing said in situ device.